United States Patent [19]
Paoli

[11] 4,106,096
[45] Aug. 8, 1978

[54] DERIVATIVE MEASUREMENT BY FREQUENCY MIXING

[75] Inventor: Thomas Lee Paoli, Basking Ridge, N.J.

[73] Assignee: Bell Telephone Laboratories, Incorporated, Murray Hill, N.J.

[21] Appl. No.: 718,403

[22] Filed: Aug. 30, 1976

[51] Int. Cl.$^2$ .................. G06G 7/18; G01R 19/00
[52] U.S. Cl. .................. 364/481; 324/158 D; 325/363; 364/484; 364/828
[58] Field of Search .................. 235/150.3; 307/233 R, 307/271; 321/60; 331/37, 38; 324/158 SC, 85, 87, 79 R, 119, 158 D; 364/732, 828, 605, 483, 484, 489; 325/363, 133, 134

[56] References Cited

U.S. PATENT DOCUMENTS

| 3,745,473 | 7/1973 | Klein et al. | 328/133 |
| 3,812,433 | 5/1974 | Bradley | 328/133 |
| 3,882,402 | 5/1975 | Jensen | 328/133 |
| 4,001,680 | 1/1977 | Bylund et al. | 328/133 |
| 4,062,632 | 12/1977 | Dixon | 324/158 D |

OTHER PUBLICATIONS

Warren et al.; "An Analysis of the Intermodulation Method of Distortion Measurement"; Proc. of the Ire; vol. 36, pp. 457–466, Apr. 1948.

Klein et al.; Generating the Sum or Difference of Two Signal Frequencies; Electronic Engineering; Mar. 1969, pp. 378–380.

Dyer; Concurrent Characterization of SCR Switching Parameters for Inverter Applications, SCR & Solid State Technology, Apr. 1965—pp. 15–20.

Primary Examiner—Malcolm A. Morrison
Assistant Examiner—Errol A. Krass
Attorney, Agent, or Firm—Michael J. Urbano

[57] ABSTRACT

A dual-frequency technique for electronically measuring high-order derivatives by frequency mixing is described. The technique utilizes an ac modulation at two distinct but synchronous frequencies to produce a derivative signal at a useful difference frequency, which is unique to the order of the derivative being measured. By appropriate selection of the frequencies, significant advantages are obtained compared to the conventional method in which derivatives are measured at harmonics of a single frequency. The technique is illustrated with a practical measurement of the second derivative of the electrical characteristic of a silicon rectifier diode.

5 Claims, 2 Drawing Figures

DERIVATIVE MEASUREMENT BY FREQUENCY MIXING

BACKGROUND OF THE INVENTION

This invention relates to the measurement of high-order derivatives of device parameters and, more particularly, to a frequency mixing scheme for measuring $d^nV/dI^n$ ($n \geq 2$) of nonlinear devices especially those having an exponential relationship between voltage V and current I.

Derivative techniques have been widely used to detect fine structure in the electrical characteristics of semiconductor devices such as tunnel diodes (Korb et al., *Rev. Sci. Instr.*, Vol. 43 p. 90 (1972)), transistors, junction diodes, and most recently double-heterostructure junction lasers. The experimental technique commonly involves sinusoidally modulating an independent variable, such as current or voltage, and detecting the ac response of the dependent variable. A measure of the first derivative of the electrical characteristic is then provided by the ac component of the device response at the frequency of modulation, while the second derivative is in principle proportional to the sinusoidal response at twice the modulation frequency. However, as pointed out by Korb et al. supra, a practical realization of the second derivative measurement encounters two problems. First, the detection of the second harmonic signal requires rejection of the fundamental signal, which for weakly nonlinear characteristics can be one or more orders of magnitude greater than the harmonic signal. Adequate attenuation of the fundamental without appreciable loss for the second harmonic requires a frequency selectivity which is not easily attained without sophisticated and expensive electronics. Without adequate rejection, the strong fundamental may saturate the low signal preamplification required to detect the weak second harmonic or at least contribute spuriously to its magnitude. Secondly, the presence of even a small degree of harmonic distortion in the modulation signal produces a second harmonic signal proportional to the first derivative and consequently an incorrect measure of the second derivative.

SUMMARY OF THE INVENTION

In accordance with an illustrative embodiment of my invention a dual-frequency technique is used to measure high-order derivatives of parameters of nonlinear devices, especially those having an exponential relationship between voltage and current (e.g., silicon rectifier diodes and semiconductor junction lasers). The technique utilizes ac modulation at two distinct but synchronous frequencies $f_1$ and $f_2$ to produce a derivative signal at a difference frequency $f_d$, which is unique to the order of the derivative being measured. By appropriate selection of the frequencies, the frequency selectivity required of the electronics is greatly reduced compared to that needed for conventional harmonic detection and may easily be attained with conventional filters. In addition, the effect of spurious signals from harmonic distortion of the modulation signal is virtually eliminated since the frequency $f_d$ at which the desired derivative signal appears is not coincident with a harmonic of the modulating frequencies. The technique is illustrated by a measurement of the second derivative of the electrical characteristic of a silicon rectifier diode. This derivative provides useful information in the form of the exponential factor of the diode, a parameter frequently measured to maintain quality control.

BRIEF DESCRIPTION OF THE DRAWING

My invention, together with its various features and advantages, can be readily understood from the following more detailed description taken in conjunction with the accompanying drawing, in which.

DETAILED DESCRIPTION

As is well-known from previous analyses (e.g., Korb et al. supra) of derivative measurements, the ac response of a nonlinear device to a weak modulation is best discussed in terms of a power series expansion in terms of the modulated parameter. For concreteness, consider a device with a nonlinear voltage-current characteristic, such as a junction diode, although similar considerations can be applied to other devices or parameters. With a small current modulation i(t) superimposed on a bias current I, the series expansion for the voltage V developed across the device is $$V(t) = V(I) = \sum_{n=1}^{\infty} \frac{i^n(t)}{n!} \frac{d^nV}{dI^n} \qquad (1)$$

In response to a current modulation applied at two frequencies $f_1$ and $f_2$, the linear term in the expansion gives rise to sinusoidal components at $f_1$ and $f_2$, each of which is proportional to the first derivative dV/dI. Analogously, the quadratic term in the series produces signals at $2f_1$, $2f_2$, and $f_1-f_2$ all of which are proportioal to the second derivative $d^2V/dI^2$. In principle, the second derivative can be measured by the signal at $2f_1$ or $2f_2$. However, in accordance with my invention detection at the difference frequency $f_d = f_1 - f_2$, where $f_1$ and $f_2$ are synchronous (phase-locked), is advantageous for two reasons. First, by appropriate selection of the frequencies, the frequency selectivity of conventional components can be used more effectively than with second harmonic detection. For example, with $f_1 = 50$ kHz and $f_2 = 45$ kHz, the frequencies of the strong fundamental signal are 9 or 10 times larger than the difference frequency of 5 kHz. Consequently, a conventional lowpass filter tuned to the difference frequency can provide much more attenuation of the fundamental than a filter tuned to the second harmonic. In addition, the exact value of $f_d$ can be selected for optimum signal-to-noise ratio in the detector for those cases which require maximum sensitivity. Secondly, harmonic distortion of the modulation which produces a spurious signal proportional to the first derivative does not contribute to the second derivative measured at $f_1-f_2$. Consequently, the distortion requirements imposed on the modulator are less stringent with detection at the difference frequency than with second harmonic detection.

Figure 1:
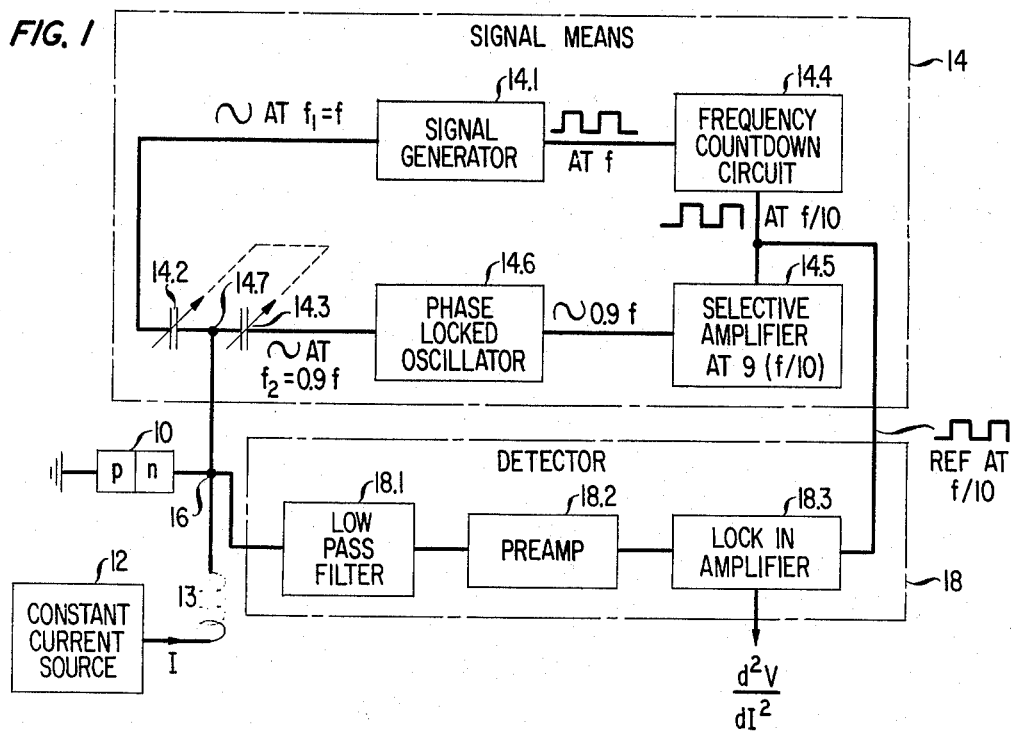
FIG. 1 is a block diagram of apparatus used to measure the second derivative $d^2V/dI^2$ of a p-n junction diode in accordance with an illustrative embodiment of my invention.

As an illustration of the technique, the apparatus shown schematically in FIG. 1 was constructed to measure the second derivative of the voltage-current characteristic of a p-n junction device 10.

The apparatus comprised a constant current source 12 which supplied a bias current I to the device 10. Source 12 was isolated by a choke 13 from ac signals generated by signal means 14. The latter comprised a signal generator 14.1 having two outputs: one a sinusoid at frequency $f_1 = f$ applied to one side of a pair of ganged, series connected, tunable capacitors 14.2 and 14.3, and the other a square wave at frequency (repetition rate) f applied to the input of a frequency countdown (frequency divider) circuit 14.4. The output of countdown circuit 14.4, a square wave at frequency $0.1f$, was applied to the input of a selective amplifier 14.5 which detected the ninth harmonic of its input and generated a sinusoid at $0.9f$ at its output. The latter was applied to the input of a phase-locked oscillator 14.6 the output of which, a sinusoid at $f_2 = 0.9f$ (phase-locked to the sinusoid at $f_1$), was applied to the other side of the ganged capacitors. The synchronous sinusoids at $f_1$ and $f_2$ were applied to the device 10 by connecting node 14.7 between the capacitors to node 16 between device 10 and choke 13.

The apparatus also included a detector 18 comprising the series combination of a low pass filter 18.1, a preamplifier 18.2 and a lock-in amplifier 18.3. The input to filter 18.1 was connected to node 16, the reference for the lock-in amplifier was the square wave at $0.1f$ generated by countdown circuit 14.4, and the output of the detector, a signal proportional to $d^2V/dI^2$, was the output of amplifier 18.3.

In operation current supplied to the diode 10 was modulated at the phase-locked frequencies $f_1 = 50$ kHz and $f_2 = 0.9 f_1 = 45$ kHz. The coherent signals were derived from signal generator 14.1 (Hewlett-Packard, model 203A) with synchronous sinusoidal and square-wave outputs at 50 kHz. The distortion level (0.06 percent) of this generator was more than adequate to eliminate spurious contributions to the second derivative signal. The sinusoidal output was capacitively coupled to the diode 10, while a coherent signal at 45 kHz was derived from the square-wave output by down-converting its frequency to 5 kHz and then extracting the ninth harmonic of the resulting square-wave to synchronize phase-locked oscillator 14.6. The frequency countdown was provided by a commercially available integrated circuit 14.4, while the selective amplifier 14.5 was a Princeton Applied Research (PAR) model 210. The reference channel of a PAR model 124 lock-in amplifier 18.3 provided the phase-locked sinusoid at 45 kHz with adequate voltage. The two signals were coupled to the diode through capacitors 14.2 and 14.3 whose values were kept low (e.g., 100 pf) in order to modulate with constant current amplitude. In the detector 18 the strong fundamental signals at $f_1$ and $f_2$ were rejected with a conventional low pass passive filter 18.1. The use of a passive filter is advantageous because an active filter would tend to overload from the strong fundamental signals. Because of the high ratio between $f_1, f_2$ and $f_1 - f_2$ the filter 18.1 provided more than 80 db of attenuation at the fundamental frequencies with an insertion loss of only about 1 db at 5 kHz. After filtering and preamplification, the second derivative signal at 5 kHz was detected with lock-in amplifier 18.3 (PAR model HR8). Reference for the phase-sensitive detection was obtained directly from the countdown circuit 14.4.

A p-n junction diode is commonly modeled by a resistance R in series with an ideal p-n junction. The junction is characterized by a current I which varies exponentially with applied voltage V as $$I = I_s[\exp q(V-IR)/\eta kT - 1] \qquad (2)$$

where $I_s$ is the saturation current and $\eta$ is an exponential parameter usually characteristic of the mechanism by which the current flows. The first and second derivatives of this characteristic are given by $$\frac{dV}{dI} = R + \frac{\eta kT}{q} \frac{1}{(I + I_s)} \qquad (3)$$

$$\frac{d^2V}{dI^2} = - \frac{\eta kT}{q} \frac{1}{(I + I_s)^2} \qquad (4)$$

provided $\eta$ and $I_s$ are not current-dependent. If the current I is restricted to values where the saturation current $I_s$ is negligible, an appropriate measure of the second derivative is obtained by displaying the product $(-I^2 d^2V/dI^2)$. This product will be a constant equal to $(\eta kT/q)$ as long as equation (2), with constant parameters $\eta$, $I_s$, and R, remains a valid approximation to the actual current-voltage characteristic.

For the purposes of illustration, measurements were made on a silicon diffused-junction rectifier diode No. 426G manufactured by Western Electric Company. This diode was actually composed of two silicon chips bonded in series with a gold preform. Each clip contained a diffused p-n junction. The I-V relation of the diode is shown by lines I and II of FIG. 2. This type of characteristic was chosen because it exhibits good exponential behavior and an anomalous change of $\eta$ and $I_s$, both of which should be reflected in the second derivative. The series resistance of this diode was measured independently using equation (3) to be 0.15 ohms and then used to calculate the junction voltage $(V - IR)$ for the horizontal scale in FIG. 2. For currents between 0.01 mA and 0.5 mA (line I) the semilog I-V curve gives $\eta kT/q = 67.3$ mV and $I_s = 3.7 \times 10^{-7}$ mA; while for currents between 2 mA and 200 mA (line II), $\eta kT/q = 130.3$ mV and $I_s = 5.1 \times 10^{-4}$ mA. In both ranges, the approximation that $I_s$ is negligible compared to I is well satisfied.

Figure 2:
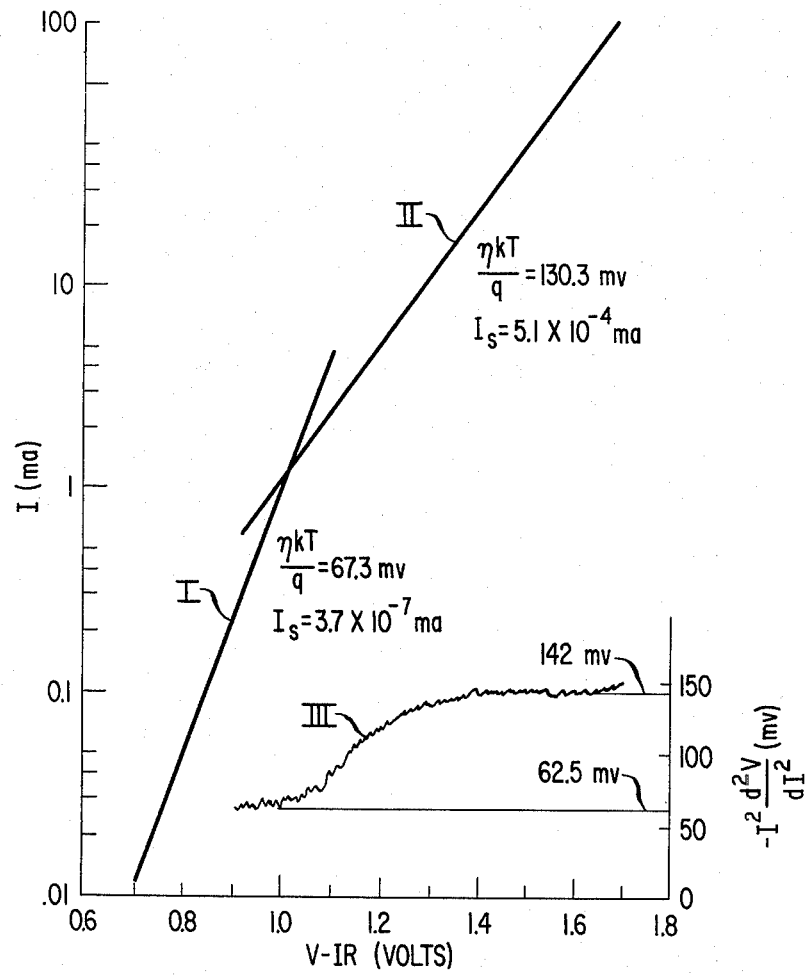
FIG. 2 is a graph of the experimentally measured current-voltage characteristic (lines I and II) and its second derivative $d^2V/dI^2$ (curve III) for a silicon diffused-junction rectifier diode. The values of $\eta kT/q$ and $I_s$ were obtained from the best linear fit to the experimental points.

The experimentally observed variation of the second derivative of this I-V characteristic is shown by curve III of FIG. 2 as a function of the voltage. The product $(-I^2 d^2V/dI^2)$ was formed electronically with a PAR multiplier and calibrated from the measurements of the first derivative $dV/dI$ as a function of current. Comparison of the behavior of $(-I^2 d^2V/dI^2)$ with the I-V characteristic itself indicates that the observed signal was an accurate representation of the second derivative. At high and low currents, where the characteristic is exponential with constant parameters, the product $(-I^2 d^2V/dI^2)$ was constant at a value which is in good agreement with the value of $\eta kT/q$ obtained from the semilog characteristic. Over the intermediate range of currents, where the I-V characteristic exhibits a distinct change of parameters, the second derivative shows a corresponding change. However, note that the sensitivity of the second derivative to small changes in the characteristic reveals that the characteristic continues to change slightly above 1.2 volts, where the semilog curve appears to be reasonably linear.

A second useful test of the derivative response of the system was obtained by replacing the junction diode with a ten-ohm resistor. Since the resistor is a linear element, the derivative signal was zero for all currents, as expected. The absence of any derivative signal with the resistor also showed that there was no feedthrough of the strong fundamental signals.

Although my dual-frequency technique has been illustrated with a measurement of a second derivative, it should be emphasized that the same approach is applicable to measurements of derivatives with order higher than two. A third derivative is sensed by a component at the "difference" frequency $f_d = f_2 - (f_1 - f_2)$. For this case, the appropriate selection of frequencies is determined by requiring $f_d$ to be the lowest frequency in the device response and the next lowest frequency, $(f_1 - f_2)$, to be some constant, $\alpha$, times as large as $f_d$. All other frequencies generated by terms of order three or lower are greater than $\alpha f_d$. The appropriate modulation frequencies for the third-derivative measurement are $f_1 = (2\alpha+1)f_d$ and $f_2 = (\alpha+1)f_d$, and the factor $\alpha$ is determined by the ability of the available electronics to eliminate feedthrough of the strong signals at $f_1$, $f_2$, and $f_1 - f_2$. Similarly, a fourth derivative is sensed at the "difference" frequency $f_d = f_2 - (f_1 - 2f_2)$ and $f_1 - 2f_2$ is taken to be $\alpha$ times $f_d$. The appropriate modulation frequencies for detection of a fourth derivative are then $f_1 = (3\alpha+2)f_d$ and $f_2 = (\alpha+1)f_d$. This selection process can be generalized to the n-th derivative with the result that $f_1 = [(n-1)\alpha + (n-2)]f_d$ and $f_2 = (\alpha+1)f_d$. Eventually, however, the factor $\alpha$ may become prohibitively large.

When operated with these values for $f_1$ and $f_2$, my dual-frequency technique provides significant advantages compared to the conventional single frequency method. Since the frequency of detection is the lowest frequency generated and is many times smaller than the nearest frequency, the frequency selectivity of conventional components can be used much more effectively than with harmonic detection to detect the weak derivative signal in the presence of strong unwanted signals. Furthermore, the detection of a difference frequency avoids the high harmonics usually associated with detection of high-order derivatives and thereby permits optimization of the signal-to-noise ratio in the detector for those cases which require maximum sensitivity. Since the detection frequency is not harmonically related to the modulation frequency, harmonic distortion of the modulation cannot contribute to the derivative measurement as it may with the single-frequency technique.

It is to be understood that the above-described arrangements are merely illustrative of the many possible specific embodiments which can be devised to represent application of the principles of out invention. Numerous and varied other arrangements can be devised in accordance with these principles by those skilled in the art without departing from the spirit and scope of the invention. In particular, the synchronous signals at $f_1$ and $f_2$ can be generated in several different ways. For example, the signal at $f_2$ can be obtained, as herein, by synchronizing an oscillator with the appropriate harmonic of an up or down-converted pulse train. Alternatively, two phase-locked signals at $f_1$ and $f_2$ can be produced by modulating the amplitude of a sinusoid at $(f_1+f_2)/2$ with a sinusoid at $(f_1-f_2)/2$.

What is claimed is:

1. A method of generating the $n$-th order ($n \geq 2$) derivative of a parameter of a nonlinear device comprising the steps of:
    applying to the device a first sinusoidal signal at a first frequency $f_1$
    applying to the device a second sinusoidal signal at a second frequency $f_2$ phase-locked to the first signal at $f_1$, and
    detecting a third signal corresponding to a difference frequency $f_d$ of $f_1$ and $f_2$, the third signal being proportional to the n-th order derivative.

2. The method of claim 1 wherein the frequency of said signals satisfy approximately the relationships:

$$f_1 = [(n-1)\alpha + (n-2)]f_d$$

$$f_2 = (\alpha+1)f_d$$

where $\alpha$ is a constant.

3. A method of generating the $n$-th order derivative of voltage with respect to current of a nonlinear device comprising the steps of:
    applying to the device a first sinusoidal current at a first frequency $f_1$,
    applying to the device a second sinusoidal current at a second frequency $f_2$ phase-locked to the first current at $f_1$, and
    detecting the resulting voltage signal across the device at a difference frequency $f_d$ of $f_1$ and $f_2$, the amplitude of the signal being proportional to the desired n-th derivative.

4. The method of claim 3 wherein the frequencies satisfy approximately the relationships:

$$f_1 = [(n-1)\alpha + (n-2)]f_d$$

$$f_2 = (\alpha+1)f_d$$

where $\alpha$ is a constant.

5. The method of claim 3 for generating the second derivative $d^2V/dI^2$ wherein $f_2$ is a fraction of $f_1$ and $f_d = f_1 - f_2$.

* * * * *